(12) United States Patent
Iwata

(10) Patent No.: US 9,612,372 B2
(45) Date of Patent: Apr. 4, 2017

(54) DIFFRACTIVE OPTICAL ELEMENT AND MANUFACTURING METHOD FOR THE SAME

(71) Applicant: CANON KABUSHIKI KAISHA, Tokyo (JP)

(72) Inventor: Kenichi Iwata, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/182,443

(22) Filed: Feb. 18, 2014

(65) Prior Publication Data

US 2014/0160567 A1 Jun. 12, 2014

Related U.S. Application Data

(62) Division of application No. 13/370,603, filed on Feb. 10, 2012, now Pat. No. 9,366,791.

(30) Foreign Application Priority Data

Feb. 21, 2011 (JP) .................................. 2011-034367

(51) Int. Cl.
*G02B 5/18* (2006.01)
*C23C 14/04* (2006.01)
(Continued)

(52) U.S. Cl.
CPC .......... *G02B 5/1876* (2013.01); *C23C 14/042* (2013.01); *C23C 14/20* (2013.01);
(Continued)

(58) Field of Classification Search
CPC ........ G02B 5/18; G02B 5/1861; G02B 6/136; G02B 1/041; G02B 5/1809; G02B 5/1876;
(Continued)

(56) References Cited

U.S. PATENT DOCUMENTS

| 3,942,873 A | 3/1976 | Shimotakahara |
| 5,176,557 A | 1/1993 | Okunuki et al. |

(Continued)

FOREIGN PATENT DOCUMENTS

| CN | 1344945 A | 4/2002 |
| CN | 1501103 A1 | 6/2004 |

(Continued)

OTHER PUBLICATIONS

Jun. 8, 2012 European Search Report in European Patent Appln. No. 12001024.4.

(Continued)

*Primary Examiner* — Scott J Sugarman
*Assistant Examiner* — Sharrief Broome
(74) *Attorney, Agent, or Firm* — Fitzpatrick, Cella, Harper & Scinto

(57) ABSTRACT

An Al film is formed so that film forming particles are incident at normal incidence to grating wall surfaces of a diffraction grating having multiple grating portions and are incident at oblique incidence to optical effective surfaces. After that, oxidation treatment is performed from a direction to be incident at normal incidence to the optical effective surface so that the Al layer on the optical effective surface is changed to $Al_2O_3$ layer. Hence, in the diffraction grating having the multiple grating portions, the $Al_2O_3$ layer is formed on the optical effective surface for transmitting light, and the Al layer is formed on the grating wall surfaces as a light shielding layer. Thus, flare of the diffractive optical element can be suppressed.

8 Claims, 2 Drawing Sheets

(51) Int. Cl.
*C23C 14/20* (2006.01)
*C23C 14/22* (2006.01)
*C23C 14/24* (2006.01)
*C23C 14/58* (2006.01)
*G02B 3/08* (2006.01)
*G02B 5/22* (2006.01)

(52) U.S. Cl.
CPC ............ *C23C 14/225* (2013.01); *C23C 14/24* (2013.01); *C23C 14/5853* (2013.01); *G02B 3/08* (2013.01); *G02B 5/18* (2013.01); *G02B 5/1814* (2013.01); *G02B 5/1842* (2013.01); *G02B 5/1895* (2013.01); *G02B 5/22* (2013.01)

(58) Field of Classification Search
CPC .......... G02B 5/201; G02B 6/34; G02B 6/124; G02B 6/10; G02B 1/04; G02B 1/11; C03C 15/00; C03C 15/02; C03C 2204/08; C03C 17/3411; C03C 2217/91
USPC ................... 359/571, 572, 900, 566; 216/24
See application file for complete search history.

(56) References Cited

U.S. PATENT DOCUMENTS

| | | |
|---|---|---|
| 5,201,681 A | 4/1993 | Okunuki et al. |
| 5,676,804 A | 10/1997 | Fujii et al. |
| 5,801,889 A | 9/1998 | Meyers et al. |
| 6,476,968 B1 | 11/2002 | Kato et al. |
| 6,839,173 B2 | 1/2005 | Shimmo et al. |
| 7,042,642 B2 | 5/2006 | Tokoyoda et al. |
| 7,501,001 B2 | 3/2009 | Rosenflanz et al. |
| 7,864,427 B2 | 1/2011 | Korenaga et al. |
| 8,149,510 B2 | 4/2012 | Korenaga et al. |
| 8,270,080 B2 | 9/2012 | Nakabayashi |
| 2002/0001672 A1* | 1/2002 | Pan .................... C23C 14/0694 427/162 |
| 2002/0044359 A1 | 4/2002 | Shimmo et al. |
| 2003/0112515 A1 | 6/2003 | Nakabayashi |
| 2003/0179453 A1* | 9/2003 | Mori .................... G02B 5/1857 359/569 |
| 2005/0018299 A1 | 1/2005 | Tokoyoda et al. |
| 2006/0079037 A1 | 4/2006 | Hoffman et al. |
| 2006/0170329 A1* | 8/2006 | Tojo et al. .................... 313/495 |
| 2006/0183342 A1* | 8/2006 | Bruyns .................... H05K 3/02 438/768 |
| 2006/0209411 A1* | 9/2006 | Delage et al. ................. 359/566 |
| 2006/0227283 A1 | 10/2006 | Ooi et al. |
| 2008/0231956 A1* | 9/2008 | Yasui ....................... G02B 1/04 359/576 |
| 2009/0027776 A1 | 1/2009 | Schall et al. |
| 2009/0168819 A1 | 7/2009 | Otoma |
| 2010/0002302 A1* | 1/2010 | Duparre ............... G02B 5/1876 359/571 |
| 2010/0110548 A1 | 5/2010 | Korenaga et al. |
| 2010/0134888 A1 | 6/2010 | Korenaga et al. |
| 2010/0142053 A1 | 6/2010 | Nakabayashi |
| 2010/0213169 A1 | 8/2010 | Hiraoka |
| 2012/0320461 A1 | 12/2012 | Nakabayashi |

FOREIGN PATENT DOCUMENTS

| | | |
|---|---|---|
| CN | 101253425 A | 8/2008 |
| CN | 101750653 A | 6/2010 |
| CN | 101965529 A | 2/2011 |
| EP | 2 264 092 A1 | 12/2010 |
| JP | 56-080654 A | 7/1981 |
| JP | 08-136707 * | 5/1996 |
| JP | 11-251215 A | 9/1999 |
| JP | 2000-098820 A | 4/2000 |
| JP | 2002-098820 A | 4/2002 |
| JP | 2003-240931 A | 8/2003 |
| JP | 2004-219532 A | 8/2004 |
| JP | 2005-062717 A | 3/2005 |
| WO | 97/01115 A1 | 1/1997 |

OTHER PUBLICATIONS

Dec. 3, 2013 Chinese Official Action in Chinese Patent Appln. No. 201210040533.3.
Mar. 10, 2016 Chinese Official Action in Chinese Patent Appln. No. 201410474475.4.
Nov. 3, 2016 Chinese Official Action in Chinese Patent Appln. No. 201410474475.4.

* cited by examiner

DIFFRACTIVE OPTICAL ELEMENT AND MANUFACTURING METHOD FOR THE SAME

This application is a division of Application No. 13/370,603 filed Feb. 10, 2012.

BACKGROUND OF THE INVENTION

Field of the Invention

The present invention relates to a diffractive optical element to be used for an optical apparatus such as a camera or a video camera, and a manufacturing method for the same.

Description of the Related Art

A diffractive optical element typified by a diffraction grating includes multiple grating portions arranged in a concentric manner, and each of the grating portions has an optical effective surface for forming an image of incident light at a desired position and a grating wall surface that does not work as an optical element. If light from outside of an effective screen enters the grating wall surface, the light may reach a position shifted from a desired position of image formation and become flare. If there is a lot of flare, image quality is largely deteriorated. In order to suppress the flare, it is effective to form a light shielding layer on the grating wall surface, and there are proposed various methods.

U.S. Pat. No. 5,676,804 discloses a technology involving forming a primary film only on the optical effective surface, forming a film made of a light shielding material on the entire surface of the grating, and then using a lift-off method so that the light shielding layer remains only on the grating wall surface where the primary film has not been formed.

In addition, Japanese Patent Application Laid-Open No. H11-251215 proposes, as one of steps of a method of forming a resist on a stepped portion, a method of forming an antireflection film only on the grating wall surface. Specifically, the method includes forming a uniform film of an antireflection material on the entire surface of the substrate, and then performing etch back of the entire surface of the substrate by reactive ion etching so that the antireflection film remains only on the grating wall surface.

According to the above-mentioned conventional technologies, it is possible to form the light shielding layer on the grating wall surface, but there are problems as follows. The method disclosed in U.S. Pat. No. 5,676,804 is a vapor deposition method having strong directivity in which a film forming angle is optimized and devised so that the film is formed only on the optical effective surface, but actually, wraparound to the grating wall surface cannot be suppressed. The primary film formed on the grating wall surface has a density lower than that of the primary film formed on the optical effective surface. In this state, if the light shielding material is formed on the entire optical element, a light shielding film on the grating wall surface becomes a low density film imitating the underlayer. A state of the low density film formed on the grating wall surface changes largely depending on an angle between the grating wall surface and the grating slope. If the angle is approximately 80 degrees, film density of the low density film becomes approximately ¼ to ⅓ of that of a high density film. Further, when the lift-off process is performed, there occurs a problem that the light shielding layer that must remain on the grating wall surface is partially removed. If the density of the light shielding film is low, light shielding ability as a film is decreased, and hence a sufficient effect for the flare suppression cannot be obtained.

Further, there is another problem in that a region where the light shielding layer is not formed occurs on the grating wall surface. This is caused by the fact that the film made of a light shielding material is not formed near the lower end portion of the grating wall surface because the light shielding material is formed in the state in which the primary film is formed on the entire optical effective surface. If the region where the light shielding layer is not formed occurs on the grating wall surface, the flare suppression is not performed on the region, and hence a sufficient effect for the flare suppression cannot be obtained as a whole.

In Japanese Patent Application Laid-Open No. H11-251215, anisotropic etching is performed by oxygen reactive ion etching (RIE) so as to attempt to remove only the film of the flat portion. However, because the film having uniform density and thickness is formed on the entire surface, a contrast of etching rate between the flat portion and the grating wall surface cannot be obtained sufficiently. As a result, when etching the flat portion, the grating wall surface is also etched and the film of the grating wall surface becomes a low density film, and hence a desired function of the film cannot be obtained sufficiently. As a specific problem in a case of a diffraction grating, light shielding performance is insufficient so that a sufficient effect for the flare suppression cannot be obtained. On the contrary, if the etching is stopped in the state in which sufficient light shielding performance can be obtained in the film of the grating wall surface, the film remains also on the optical effective surface, and hence a problem such as a decrease in transmittance occurs.

Further, if the material to be etched is an organic film, it is easy to form a wall surface protection film that is important for the anisotropic etching. However, if the material to be etched is an inorganic material, the wall surface protection film is formed less because the etching rate is low. Therefore, there is also a problem in that when the inorganic material is etched, etching rate contrast cannot be secured compared with the case of the organic material.

SUMMARY OF THE INVENTION

It is an object of the present invention to provide a diffractive optical element and a manufacturing method for the same, which enable forming a light shielding layer having high light shielding ability on a grating wall surface without deteriorating optical characteristics of an optical effective surface of the diffractive optical element.

In order to attain the above-mentioned object, according to the present invention, there is provided a diffractive optical element comprising multiple grating portions including grating optical effective surfaces and grating wall surfaces continuously formed on a surface thereof, wherein each of the grating optical effective surfaces of the multiple grating portions includes an $Al_2O_3$ layer formed thereon, and each of the grating wall surfaces of the multiple grating portions includes an Al layer formed thereon.

According to the present invention, there is provided a manufacturing method for a diffractive optical element, comprising forming multiple grating portions including grating optical effective surfaces and grating wall surfaces continuously on a surface of a base substrate, forming an Al layer so that film forming particles are incident at normal incidence to each of the grating wall surfaces of the multiple grating portions, and are incident at oblique incidence to each of the grating optical effective surfaces of the multiple grating portions, and performing oxidation treatment of the Al layer from a direction to be incident at normal incidence to the each of the grating optical effective surfaces so that the Al layer on the each of the grating optical effective surfaces is changed to an Al₂O₃ layer.

Further features of the present invention will become apparent from the following description of exemplary embodiments with reference to the attached drawings.

DESCRIPTION OF THE EMBODIMENT

Preferred embodiments of the present invention will now be described in detail in accordance with the accompanying drawings.

Figure 1A:
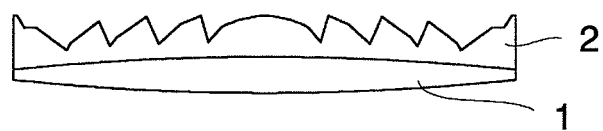
FIG. 1A is a cross sectional view of a diffractive optical element according to the present invention.
Figure 1B:
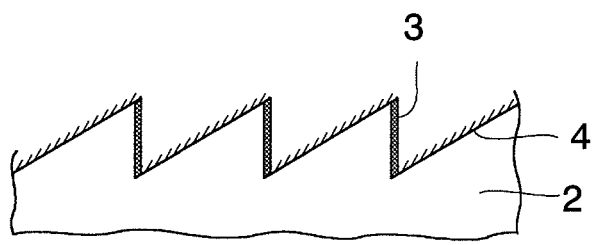
FIG. 1B is a cross sectional view of a diffractive optical element according to the present invention.

FIG. 1A illustrates a diffractive optical element according to an embodiment of the present invention. On a base substrate 1, there is formed a diffraction grating (blazed diffraction grating) 2 made of a light curing resin. The material of the base substrate 1 and the diffraction grating 2 formed thereon may be any one of glass and a resin as long as the material satisfies optical characteristics, endurance, and reliability. In addition, as a shape of the diffraction grating 2 having multiple grating portions, the blazed type is exemplified as a typical example, but other types that satisfy the optical characteristics may be used. FIG. 1B is an enlarged view of a part of FIG. 1A. An Al layer 3 formed on each grating wall surface of the multiple grating portions of the diffraction grating 2 on the base substrate is formed to be a high density film and to have a sufficient film thickness for absorbing undesired light. Usually, if the film density is 2.0 g/cm³ or more and 2.7 g/cm³ or less, and the film thickness is 50 nm or more and 1 μm or less, the film has sufficient a light shielding property against undesired light, which is an appropriate operating condition. If the film density of the Al layer 3 is less than 2.0 g/cm³, a sufficient light shielding property against undesired light cannot be obtained. On the other hand, the increase in density poses no particular problem, and hence the film density of the Al layer 3 is suitably used up to 2.7 g/cm³, which is the maximum density of Al under atmospheric pressure. Further, if the film thickness of the Al layer 3 is less than 50 nm, a sufficient light shielding property against undesired light cannot be obtained. If the film thickness is more than 1 μm, the influence of a light shielding layer on a light transmitting surface is increased, and diffraction efficiency is lowered.

Note that, the Al layer 3 may function as a reflecting material depending on an angle between the grating wall surface and an optical effective surface. In this case, image formation of the undesired light is performed outside effective pixels (in a barrel or the like) so that flare is suppressed.

On the other hand, an Al₂O₃ layer 4 formed on the optical effective surface is a low density thin film but does not cause scattering of visible light so as to be optically transparent.

Usually, if the film density of the Al₂O₃ layer 4 is 0.4 g/cm³ or more and 1.0 g/cm³ or less, and the film thickness is 5 nm or more and 30 nm or less, an appropriate operating condition is obtained. If the film density of the Al₂O₃ layer 4 is less than 0.4 g/cm³, which is smaller than the Al density before oxidation treatment, an underlying resin is damaged when oxidation treatment is performed, and hence optical performance is deteriorated. If the film density is more than 1.0 g/cm³, the oxidation of Al is finished at several nm from the surface, and an unoxidized part of Al lowers the optical performance. The same is true for the film thickness. If the film thickness is less than 5 nm, the underlying resin is damaged. If the film thickness is more than 30 nm, an unoxidized part of Al is left.

Figure 2A:
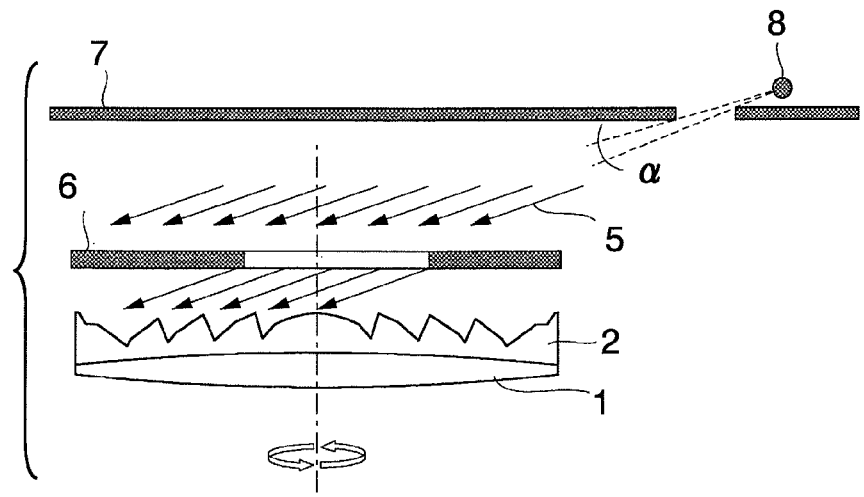
FIG. 2A is a cross sectional view illustrating a manufacturing method for the diffractive optical element according to the present invention.

Next, a manufacturing method for the diffractive optical element illustrated in FIGS. 1A and 1B is described with reference to FIGS. 2A to 2D. FIG. 2A illustrates a step of forming an Al layer on the entire surface of the diffraction grating 2. The film is formed so that film forming particles are incident at normal incidence to the grating wall surface and are incident at oblique incidence to the optical effective surface. This is for a purpose of forming a high density, thick film on the grating wall surface and a low density, thin film on the optical effective surface. The film on the grating wall surface is required to be a high density film for a purpose of shielding light. On the other hand, the optical effective surface is required to be oxidized preferentially when oxidation treatment is performed in a subsequent step, and hence the optical effective surface is made a low density film so that a reaction speed of oxidation is enhanced.

In other words, the film is formed so that the wraparound is decreased by a film forming method having a high straight going property of film forming particles 5. Specifically, there is a vapor deposition method, but the purpose can be achieved also by collimation spatter in which a spattering direction of particles is adjusted by a collimator. In FIG. 2A, the Al layer is formed by the vapor deposition method using a mask 6 and a collimator 7. An angle of the film forming particles 5 of Al, being radially scattered from a vapor deposition source 8, is restricted by the collimator 7 so as to define an incident angle (α) of the Al particles for forming the film. This angle can be adjusted according to a shape of the diffraction grating 2. The Al particles scattered in the restricted angle by the collimator 7 pass through the mask for controlling a film forming position and reach the element. The mask 6 is patterned so that the film is formed only on a half surface of the element. The reason is as follows. Usually, the diffractive optical element includes multiple grating portions arranged in a concentric manner in many cases. In this case, unless the half surface is masked for forming the film, an incident direction of the Al particles becomes normal to the grating wall surfaces on one side with respect to the center line, but is normal to the optical effective surfaces on the other side. Note that, in order to form the film on the entire element under the same condition, the element only needs to be rotated about the center axis while forming the film as illustrated in FIG. 2A.

Figure 2B:
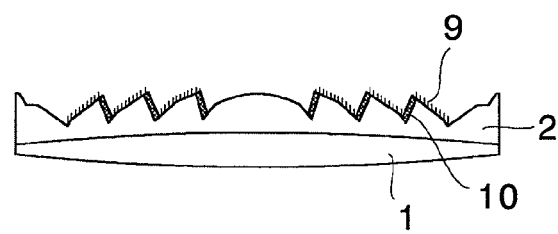
FIG. 2B is a cross sectional view illustrating a manufacturing method for the diffractive optical element according to the present invention.
Figure 2C:
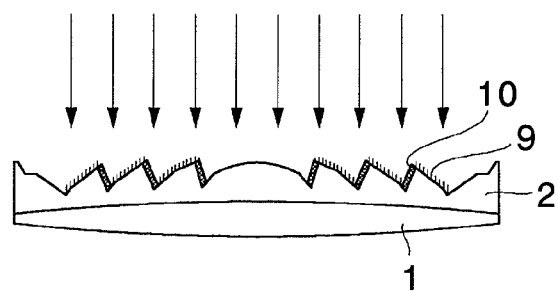
FIG. 2C is a cross sectional view illustrating a manufacturing method for the diffractive optical element according to the present invention.

As illustrated in FIG. 2B, the Al layer formed as described above is a high density film 10 on the grating wall surface without a region having no film thereon, and is a low density film 9 on the optical effective surface. Next, the oxidation treatment is performed on the entire element. As illustrated in FIG. 2C, the oxidation treatment is performed by the oxygen RIE having anisotropy from the normal incident direction to the optical effective surface. Note that, it is possible to adopt a uniform oxidation method. In the above-mentioned film forming process, there have occurred contrasts of density and film thickness between the Al film 10 on the grating wall surface and the Al film 9 on the optical effective surface. As a result, an oxidation speed is faster in the Al film 9 on the optical effective surface. Therefore, it is possible to select a process without anisotropy in the oxidation method. In addition, it is possible to perform oxidation by a method with anisotropy and use both the collimator and the mask for controlling the film forming position similarly to the Al film forming process so that a larger contrast is obtained.

Figure 2D:
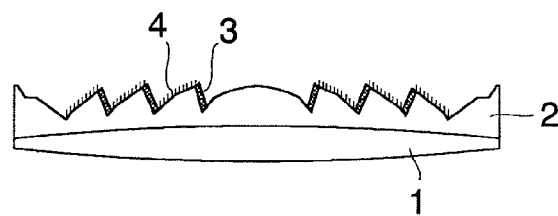
FIG. 2D is a cross sectional view illustrating a manufacturing method for the diffractive optical element according to the present invention.

By performing the oxidation treatment, the low density Al film 9 formed on the optical effective surface is instantly changed to $Al_2O_3$ so as to be transparent in the visible light region. On the other hand, because the Al film 10 on the grating wall surface has high density, oxidation reaction thereof is stopped at the surface thereof. As a result, as illustrated in FIG. 2D, it is possible to form the Al layer 3 having a high light shielding property on the grating wall surface, and to form the $Al_2O_3$ layer 4 on the optical effective surface, which does not deteriorate optical characteristics.

EXAMPLE 1

As illustrated in FIG. 1A, on the base substrate 1, the diffraction grating 2 having a desired shape using an ultraviolet curing resin was formed by replica molding so that a diffractive optical element was obtained.

The base substrate 1 was a lens of optical glass (S-BSL7, manufactured by OHARA INC.) having a radius of 58 mm and a thickness of 10.9 mm and containing boron and silicon. The ultraviolet curing resin used was a material whose main components were urethane modified polyester acrylate and dicyclopentenyloxyethyl methacrylate and in which ITO fine particles were dispersed. The grating height of the diffraction grating 2 was 10 µm, and the interval between adjacent gratings was 0.1 mm to 3.8 mm. The interval between gratings became narrower from the inside of the base substrate toward the outside.

Before forming the Al layer, oxygen plasma asking was performed on the obtained diffractive optical element at atmospheric pressure, and the diffractive optical element was cleaned. After that, as illustrated in FIG. 2A, the Al layer was formed using a vacuum vapor deposition apparatus. The film forming conditions were as follows.

Vapor deposition apparatus: ES-300 (manufactured by Canon ANELVA Corporation)
Initial degree of vacuum: $3.0 \times 10^{-4}$ Pa
Target film thickness: 200 nm
Film forming rate: 2 Å/sec
Film forming angle: 85° to 95° with respect to the grating wall surface
Rotation speed: 10 rpm Next, oxygen plasma treatment was performed under the following conditions so that the Al layer on the optical effective surface was oxidized as illustrated in FIG. 2C.

Reaction gas: $O_2$
Flow rate: 300 sccm
RF power: 2,000 W
Pressure: 80 mTorr
Time: 10 minutes
Substrate temperature: 50° C.

The element was arranged in such a direction that the grating slope is parallel to two electrodes of an RIE apparatus (such a direction that an ion acceleration direction is perpendicular to the grating slope). In other words, the element was arranged so that collisions of oxygen ions became largest at the grating slope.

The diffractive optical element having the grating wall surface shielded from light by the Al layer manufactured as described above was incorporated in an imaging optical system, and backlight flare was measured. In the measuring method, light with inclination of 15° was made to enter the diffractive optical element and to evade behind an integrating sphere of a spectrophotometer (U4000, Hitachi, Ltd.) so that diffracted light of a design order passed through while other flare light was measured.

The diffraction efficiency of the diffractive optical element was measured at $23\pm0.5°$ C. and $50\pm10\%$. As a result of the measurement, backlight flare was 0.002%. Further, diffraction efficiency of the diffractive optical element was measured. Specifically, the diffraction efficiency was measured with a spectrophotometer in a manner in which light was made to enter the diffractive optical element from the optical axis direction in a region in which the grating interval was 100 µm, and a slit for allowing only diffracted light of a design order to pass toward the exit side of the diffracted light was disposed. As a result of the measurement, the diffraction efficiency in Example 1 was 99.9% or more.

COMPARATIVE EXAMPLE 1

For comparison, the diffractive optical elements illustrated in FIG. 1A was manufactured by the same method as in Example 1. In Comparative Example 1, the Al layer on the grating wall surface and the $Al_2O_3$ layer on the optical effective surface illustrated in FIGS. 2A to 2D are not formed.

Similarly to the method of Example 1, the diffractive optical element was incorporated in the imaging optical system, and the backlight flare was measured. As a result of the measurement, the backlight flare was 0.016%.

In addition, similarly to Example 1, the diffraction efficiency was measured.

As a result of the measurement, the diffraction efficiency was 99.9% or more. It was confirmed that the flare light in Example 1 having the Al layer formed on the grating wall surface was reduced to ⅛ of the flare light in Comparative Example 1 without the Al layer on the grating wall surface. In addition, concerning the diffraction efficiency in the visible light region, the same result was obtained as that of the element without the Al layer on the grating wall surface.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-034367, filed Feb. 21, 2011, which is hereby incorporated by reference herein in its entirety.

What is claimed is:

1. An optical element comprising:
   a diffraction grating for diffracting incident light, the diffraction grating having a continuous surface including optical effective surfaces and wall surfaces that are disposed alternately and are directly connected with each other,
   wherein an aluminum oxide layer is formed on the optical effective surfaces of the diffraction grating so that incident light can pass through the optical effective surfaces, wherein an aluminum metal layer is formed on the wall surfaces of the diffraction grating so that incident light cannot pass through the wall surfaces, wherein the aluminum metal layer has a film thickness of 50 nm or more and 1 μm or less, and wherein the aluminum oxide layer has a film thickness of 5 nm or more and 30 nm or less.

2. The optical element according to claim 1, wherein the optical element has a lens function for converging light transmitted through the optical element.

3. The optical element according to claim 1, wherein the aluminum metal layer is not formed on the optical effective surfaces.

4. A diffractive optical element comprising a diffraction grating made of a resin or glass, the diffraction grating including multiple grating portions arranged in a concentric manner, each grating portion comprising a grating wall surface and a grating slope directly connected with each other, wherein an aluminum oxide layer covers and contacts with the grating slope, and wherein an aluminum metal layer covers and contacts with the grating wall surface, wherein the aluminum metal layer has a film thickness of 50 nm or more and 1 μm or less, and wherein the aluminum oxide layer has a film thickness of 5 nm or more and 30 nm or less.

5. The diffractive optical element according to claim 4, wherein light incident on the diffraction grating passes through the aluminum oxide layer and the grating slope, and wherein light incident on the diffraction grating is reflected by the aluminum metal layer and does not pass through the grating wall surface.

6. The diffractive optical element according to claim 4, wherein the diffraction grating is provided on a base substrate.

7. The diffractive optical element according to claim 4, wherein the aluminum metal layer has a film density of 2.0 g/cm$^3$ or more and 2.7 g/cm$^3$ or less, and wherein the aluminum oxide layer has a film density of 0.4 g/cm$^3$ or more and 1.0 g/cm$^3$ or less.

8. The diffractive optical element according to claim 4, wherein the grating slope is not covered with an aluminum metal layer.

* * * * *